United States Patent
Sakamoto et al.

(10) Patent No.: US 6,608,663 B2
(45) Date of Patent: Aug. 19, 2003

(54) ACTIVE MATRIX LIQUID-CRYSTAL DISPLAY DEVICE HAVING IMPROVED TERMINAL CONNECTIONS

(75) Inventors: Michiaki Sakamoto, Tokyo (JP); Choei Sugitani, Tokyo (JP)

(73) Assignee: NEC LCD Technologies, Ltd., Kanagawa (JP)

(*) Notice: Subject to any disclaimer, the term of this patent is extended or adjusted under 35 U.S.C. 154(b) by 0 days.

(21) Appl. No.: 10/056,036

(22) Filed: Jan. 28, 2002

(65) Prior Publication Data

US 2002/0067452 A1 Jun. 6, 2002

Related U.S. Application Data (62) Division of application No. 09/493,059, filed on Jan. 28, 2000, now Pat. No. 6,366,331.

(30) Foreign Application Priority Data

Jan. 29, 1999 (JP) .............................. 11-22517

(51) Int. Cl.⁷ .................. G02F 1/1345; G02F 1/136; G02F 1/1333; G02F 1/13
(52) U.S. Cl. .................. 349/149; 349/43; 349/138; 349/152; 349/187
(58) Field of Search .................. 349/42, 43, 149, 349/152, 84, 187, 138, 139, 150, 151

(56) References Cited

U.S. PATENT DOCUMENTS 6,172,730 B1 * 1/2001 Fujita ........................ 349/149

FOREIGN PATENT DOCUMENTS

| JP | 60-82685 | 6/1985 |
|---|---|---|
| JP | 1-101517 | 4/1989 |
| JP | 4-317345 | 11/1992 |
| JP | 05-119340 A * | 5/1993 |
| JP | 5-243333 | 9/1993 |
| JP | 06-018911 A * | 1/1994 |
| JP | 8-15716 | 1/1996 |
| JP | 8-271917 | 10/1996 |
| JP | 9-5767 | 1/1997 |
| JP | 10-48654 | 2/1998 |
| JP | 10-161140 | 6/1998 |
| JP | 10-253992 | 9/1998 |
| JP | 11-24094 | 1/1999 |

* cited by examiner

Primary Examiner—Tarifur R. Chowdhury
(74) Attorney, Agent, or Firm—Sughrue Mion, PLLC (57) ABSTRACT

In an active matrix liquid-crystal display device, dummy contact holes are provided between neighboring terminals, so as to prevent a poor connection between the lower metal layer of a terminal and a TAB caused by conductive particles of an ACF remaining on an organic film, and contact holes that make connections between an upper layer transparent electrode of a terminal and a lower metal layer are formed by a plurality of fine via holes, so that sufficient conductive particles of the ACF remain on the upper transparent electrode and a good connection is made to TAB connection lines.

11 Claims, 14 Drawing Sheets

ACTIVE MATRIX LIQUID-CRYSTAL DISPLAY DEVICE HAVING IMPROVED TERMINAL CONNECTIONS

This is a divisional of application Ser. No. 09/493,059 filed Jan. 28, 2000 U.S. Pat. No. 6,366,331, the disclosure of which is incorporated herein by reference.

BACKGROUND OF THE INVENTION

1. Field of the Invention

The present invention relates to an active matrix liquid-crystal display device, and more particularly to the configuration of a terminal for electrical connection to an external driving element.

2. Background of the Invention

Active matrix liquid-crystal display devices are known as flat panel displays which save space and operate on a small amount of electrical power.

Figure 11A:
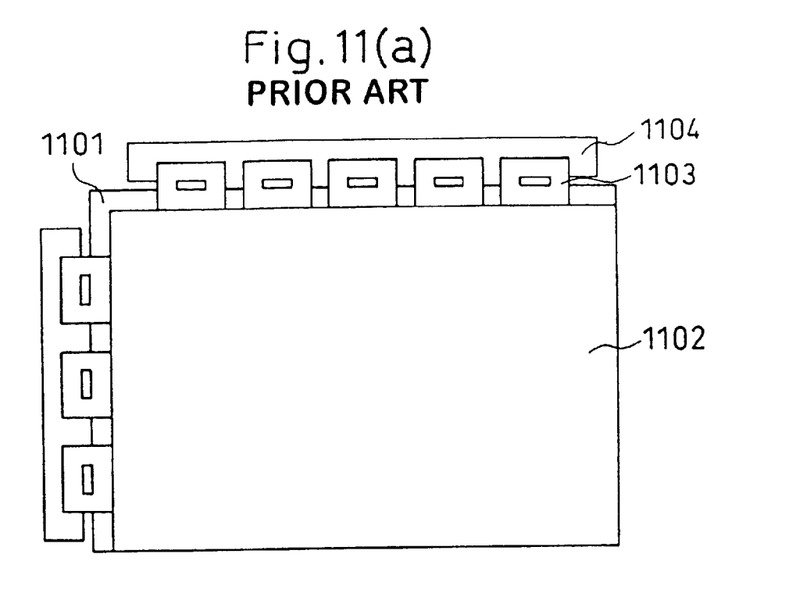
FIGS. 11(a)–(b) are drawings showing a liquid-crystal display device of the past.
Figure 11B:
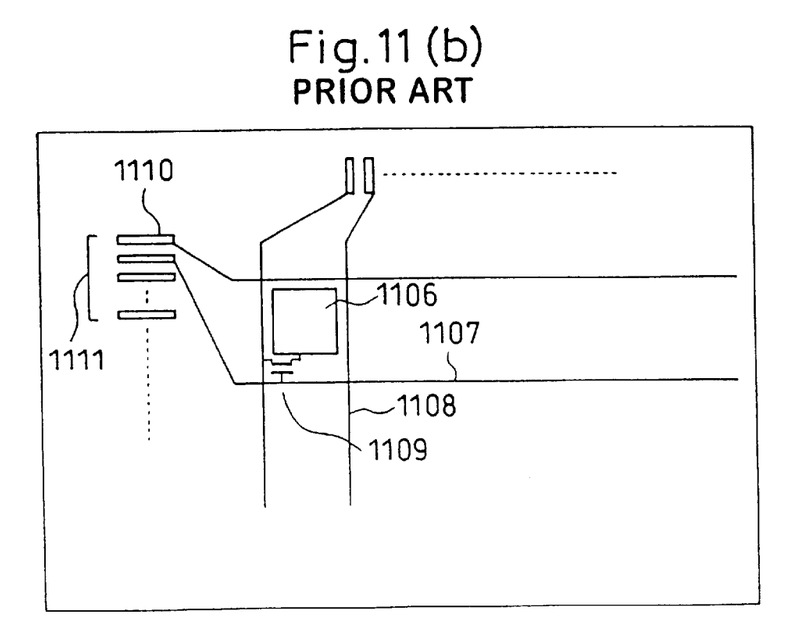

FIGS. 11(a)–(b) illustrate the concept of an active matrix liquid-crystal display device of the past, and FIG. 11(a) showing the configuration thereof, and FIG. 11(b) showing an equivalent circuit of a TFT substrate.

This active matrix liquid-crystal display device has a thin-film transistor (TFT) substrate 1101 and a color filter substrate (hereinafter referred to as a CF substrate) 1102, in between which is sandwiched a twisted nematic (TN) liquid crystal.

The TFT substrate 1101 has a plurality of pixel electrodes 1106 on a matrix, these pixel electrodes 1106 being connected to thin-film transistors (TFTs) 1109, which act as switching transistors.

Scanning lines 1107 that supply a scanning signal are connected to the gate electrodes of the TFTs, and data lines 1108, which input a display signal, are connected to the drain electrodes, so as to drive the TFTs.

In the peripheral area around the TFT substrate 1101 are provided terminals 1110 in a terminal block 1111 for the purpose of inputting scanning and display signals, these being connected to a signal processing substrate (TAB: taped automated bonding) 1103.

Additionally, the TAB 1103 is connected to an external printed circuit board 1104. The CF substrate 1102 has a RGB color layers and a light-blocking layer for the purpose of blocking light, corresponding to each of the opposing electrodes and pixels.

Figure 12A:
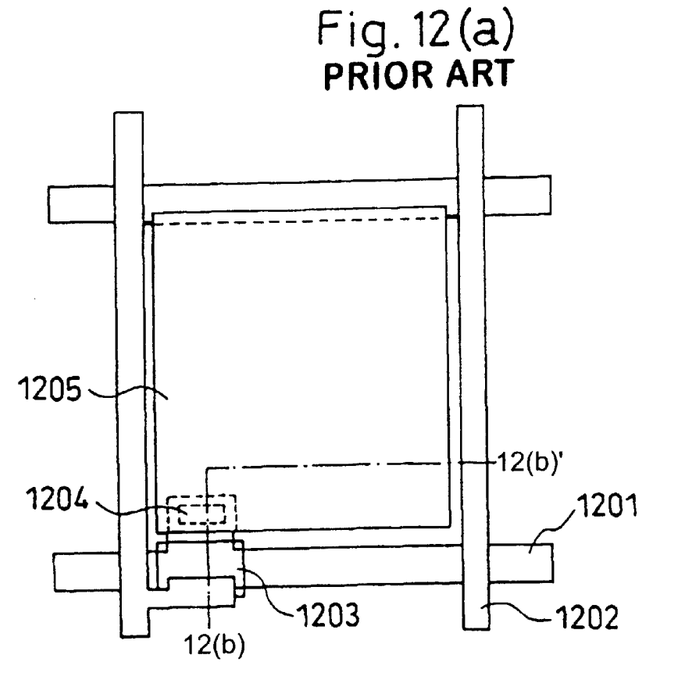
FIGS. 12(a)–(b) are drawings showing a unit element of a liquid-crystal display device of the past.
Figure 12B:
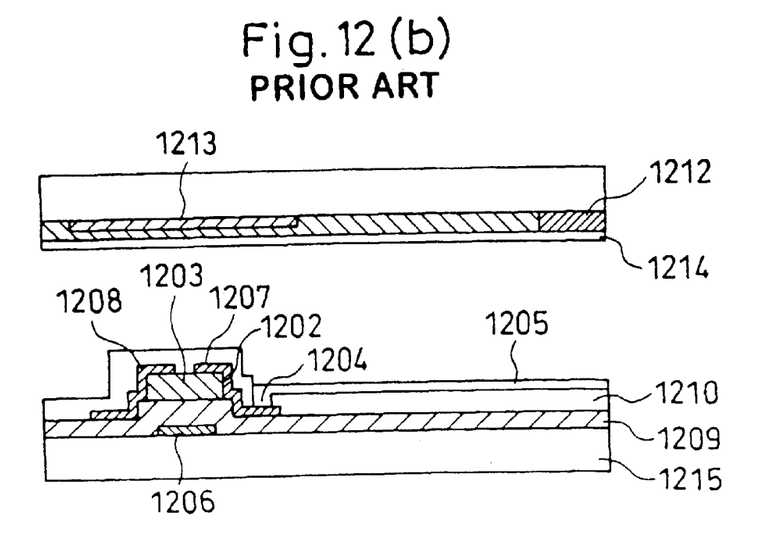

FIG. 12(a) is a plan view and FIG. 12(b) is a cross-section view of a unit element in an active matrix liquid-crystal display device of the past.

In this display device, the display device is so configured in that the TFT 1203 is formed on a TFT glass substrate 1215, and the TFT 1203 is further comprising a gate electrode 1206 connected to a scanning line 1201, a gate insulation film 1209 formed so as to cover the gate electrode 1206, a drain electrode 1208 connected to a signal line 1202 formed on the gate insulation film 1209, a source electrode 1207 connected to a pixel electrode, a passivation film 1210 formed so as to cover the above-noted elements, and a pixel electrode 1205 connected to the source electrode 1207 via a contact hole 1204 provided in the passivation film. In FIG. 12(b), a black matrix 1213 is shown opposite the TFT 1203, with opposing electrodes 1214 provided therebetween.

In the above-noted active matrix liquid-crystal display device of the past, terminals are provided around the periphery of the display device for making connection between an external substrate TAB and each one of the wirings.

Figure 13A:
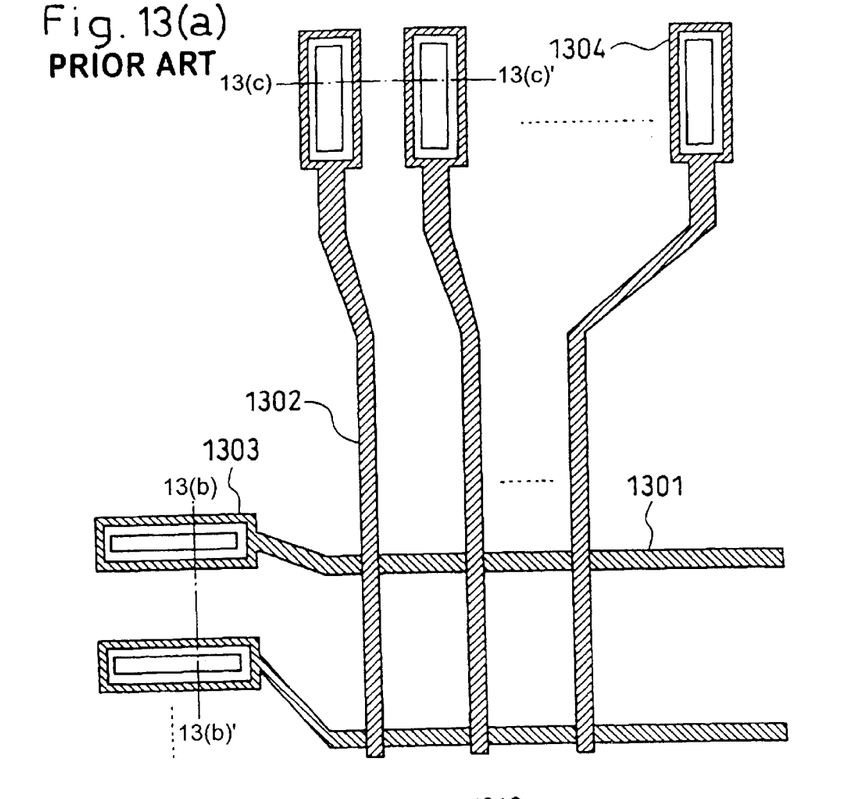
FIGS. 13(a)–(c) are drawings showing a terminal in a liquid-crystal display device of the past.
Figure 13B:
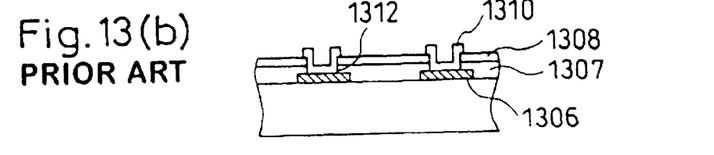
Figure 13C:
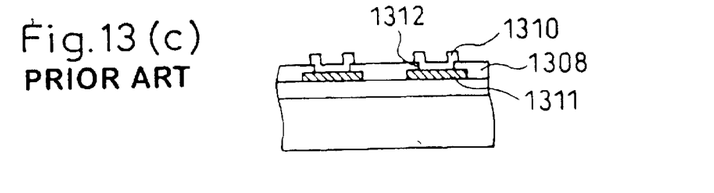

FIGS. 13(a)–(c) show the gate side terminal 1303 connected to the scanning line 1301, and the data side terminal 1304 connected to the data line 1302, FIG. 13(a) being a plan view thereof, and FIG. 13(b) and FIG. 13(c) being cross-section views in the directions indicated by the lines 13(b)–13(b)' and 13(c)–13(c)'.

The gate side terminal 1303 is provided with a gate layer metal 1306 for forming a gate electrode or the like, onto one region of which is formed a contact hole 1312, a transparent electrode 1310 forming a pixel electrode, for example, being formed as the uppermost layer so as to cover the gate layer metal. A gate insulation film 1307 and a passivation film 1308 are also provided.

A data side terminal 1304 is provided with a data layer metal 1311 forming a drain electrode, for example, on one region of which is formed a contact hole 1312, a transparent electrode 1310 forming a pixel electrode, for example, being formed as the uppermost layer so as to cover the gate layer metal.

These terminals are connected to TAB lead wires by heating and applying pressure to an anisotropic conductive film (ACF) made of a thermally cured adhesive throughout which fine conductive particles are uniformed dispersed.

In a TFT substrate of the past, an inorganic film of a material such as SiN having a thickness of 200 to 400 nm is used as a passivation layer, and there was no overlap between pixel electrodes and wires.

Recently, however, there has been a disclosure, for example, in U.S. Pat. No. 5641974, of a technology for causing overlap between a pixel electrode and a wire and broadening the transparent region.

When this is done, in order to reduce the capacitance between the pixel electrode and the signal wires, further patterning is done of an organic film on the passivation film, this being formed to a thickness of 2 to 4 $\mu$m.

Figure 14A:
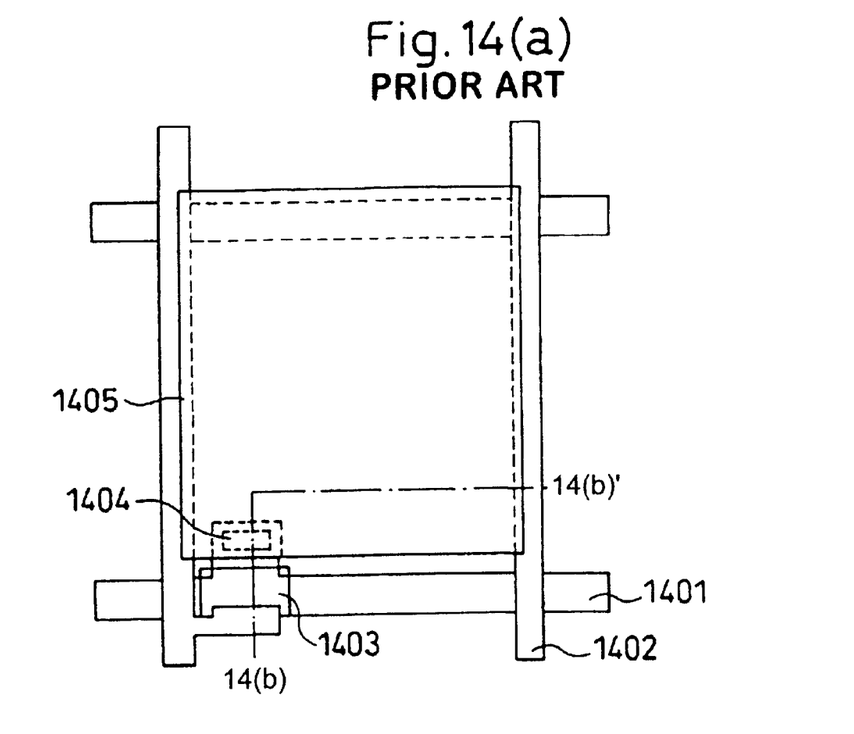
FIGS. 14(a)–(b) are drawings showing the unit terminal in U.S. Pat. No. 5,641,974.
Figure 14B:
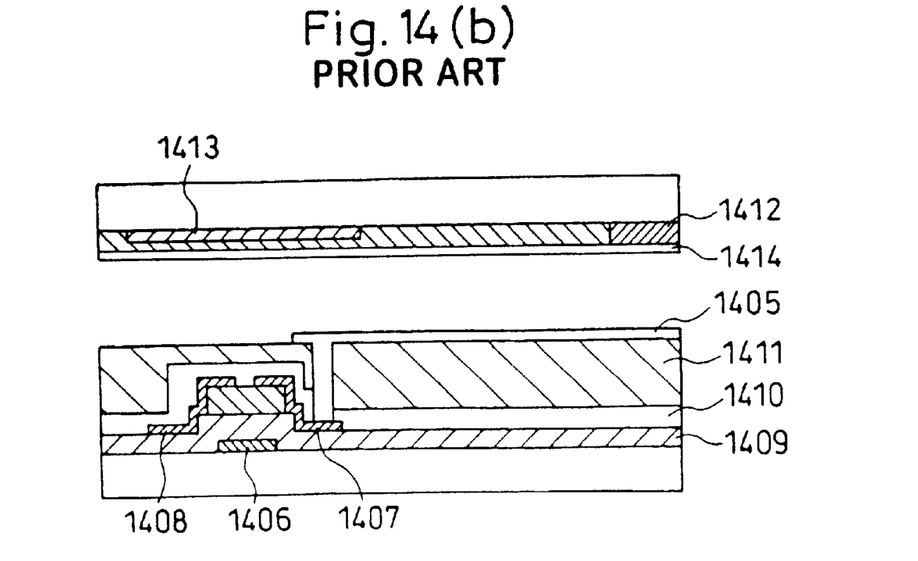

FIGS. 14(a)–(b) show the scanning line 1401 and the data line 1402, FIG. 14(a) being a plan view thereof, and FIG. 14(b) being a cross-section view in the directions indicated by the lines 14(b)–14(b)', in which the above-noted organic film is used in an interlayer insulation film.

The process up until the patterning of the passivation film 1410 is the same as in the past, a photosensitive organic film 1411 of acrylic resin or the like is spin-coated onto the passivation film 1410, and this is exposed and developed so as to form a pattern for contact holes 1404 or the like.

When this is done, the organic film in the terminal region is removed, and post-baking is done to thermally harden the organic film.

Finally, a pixel electrode 1405 is formed, and connection is made to the source electrode 1407 of the TFT 1403. In FIG. 13(b), a black matrix 1413 is shown opposite the TFT 1403, with opposing electrodes 1414 provided therebetween.

In the above-noted technology disclosed in U.S. Pat. No. 5,641,974, the transparent region is larger and it is possible to obtain a liquid-crystal display device with brighter and better display performance than in the past.

However, because the passivation film patterning and organic film patterning are performed in different process steps, the number of patterning steps increases, thereby complicating the process and increasing the manufacturing cost.

To solve the above-noted problems, a method was proposed in Japanese Patent Application No. 9-323423, whereby two layers of resist are used to perform organic film patterning and passivation film patterning simultaneously. FIGS. 15(a)–(d) show the process flow using this method to form a contact hole.

Figure 15A:
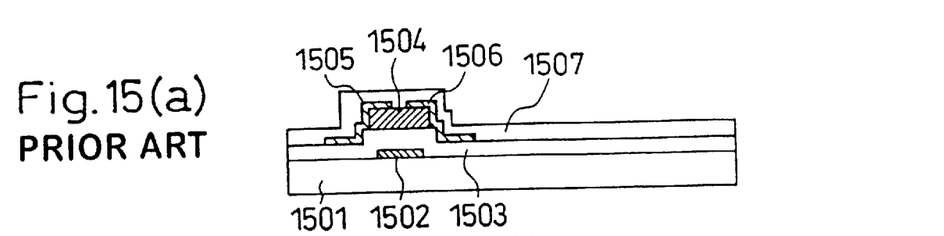
FIGS. 15(a)–(d) are drawings showing the process flow in the Japanese Patent Application No. 9-323423.
Figure 15B:
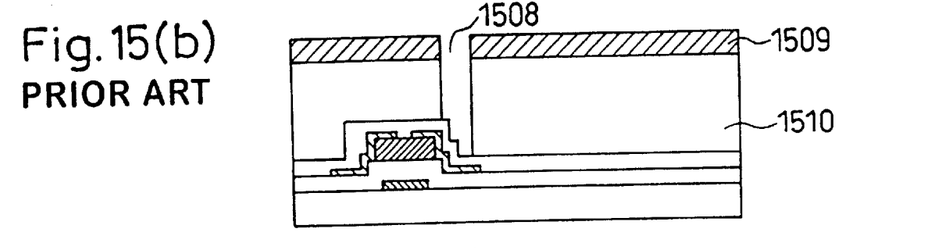

Steps up until the formation of the passivation film 1507 are the same (i.e., forming a TFT on a TFT substrate 1501 having a gate electrode 1502, a drain electrode 1505, a source electrode 1506, gate insulation film 1503, an amorphous silicon layer 1504 and a passivation film 1507) as in the prior art (FIG. 15(a)). After continuous application of the organic film 1510 and the resist 1509, exposure and developing are done to simultaneously pattern the resist and wet etch the organic film to form contact hole 1508 (FIG. 15(b)).

Figure 15C:
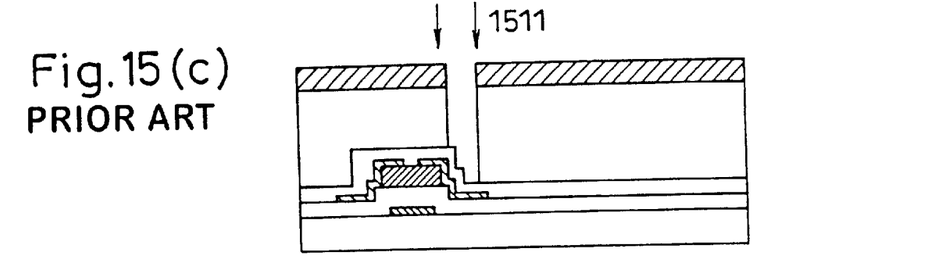

Then, the patterning of the passivation film 1507 is dry-etched with etching gas 1511 using the resist 1509 and organic film 156110 as a mask (FIG. 15(c)).

Figure 15D:
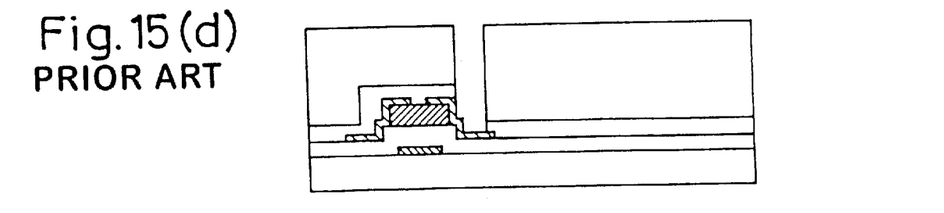

Finally, the resist 1509 only is selectively melted with a specific removing liquid so as to remove the resist (FIG. 15(d)).

When this is done, because one and the same mask is used to pattern the organic film and the passivation film, it is not possible to remove the organic film on the terminal part.

Figure 6A:
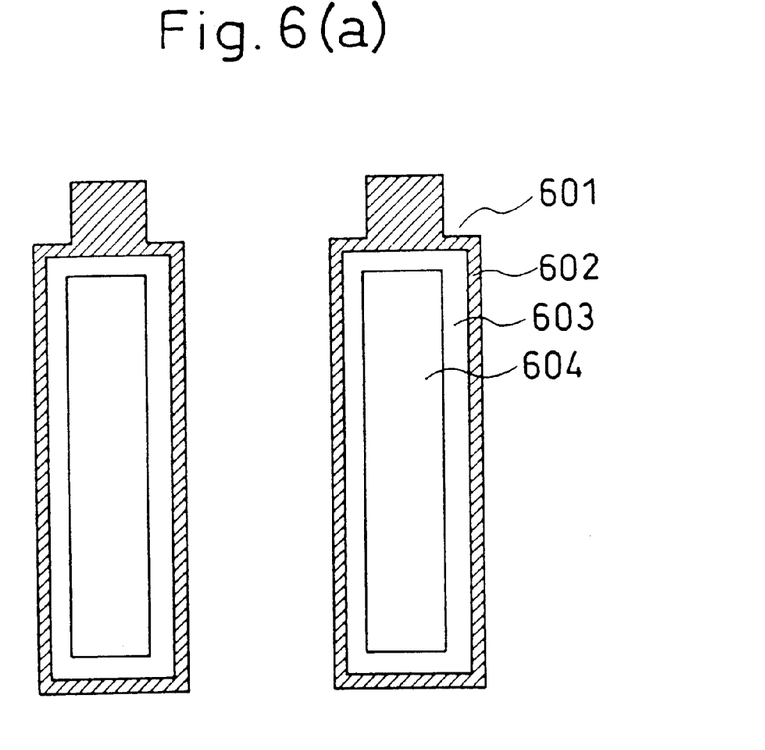
FIGS. 6(a)–(b) are drawings illustrating an improper pressure application in which the organic film remains.
Figure 6B:
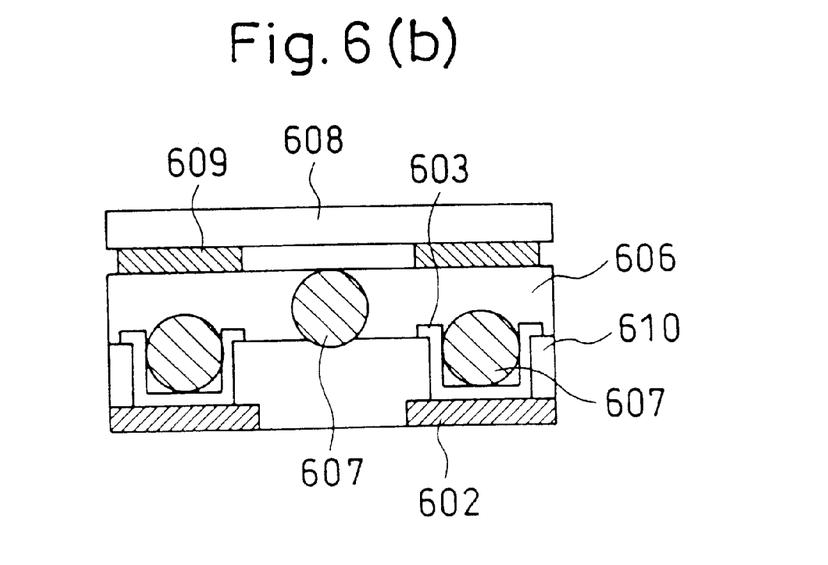

FIGS. 6(a)–(b) show how the TAB 608 and the terminal 601 are connected. In order to distribute the conductive particles 607 uniformly throughout the anisotropic conductive film 606, the diameter of the conductive particles 607 is generally in the range of 2 to 4 $\mu$m.

On the other hand, because the thickness of the organic film is 2 to 4 $\mu$m, if many conductive particles 607 remain on the organic film 610, the distance between the lower metal layer 602 of the terminal 601 and the tape carrier package 608 (TCP) is larger than the diameter of the conductive particles 607, making it difficult to obtain a good contact between the terminal 601 and the TCP 608.

In U.S. Pat. No. 5,641,974, for the purpose of reducing the capacitance beetween the pixel electrodes and the signal wires, if when an active matrix substrate has a patterned photosensitive acrylic resin on a passivation film, the number of patterning steps increases by one in comparison with the process for producing an active matrix substrate of the prior art.

To solve this problem, there is disclosed in Japanese Patent Application No. 9-323423, technology whereby two layers of resist are used to performing organic film and passivation film patterning simultaneously, thereby reducing the number of patterning steps to the same as with the prior art.

In this case, because a thick organic film remains on the terminal part, if many conductive particles remain on the organic film, it is not possible to obtain a good contact between the terminal and the TAB.

Accordingly, it is an object of the present invention to provide a terminal structure which makes it possible to obtain a good contact between a terminal and a TAB in an active matrix substrate in which an organic film and a passivation film are patterned simultaneously.

SUMMARY OF THE INVENTION

In order to achieve the above-noted objects, the present invention has the following basic technical constitution.

Specifically, the present invention is an active matrix liquid-crystal display device comprising a substrate, a plurality of switching elements and a plurality of pixel electrodes formed in a matrix arrangement on the substrate, scanning lines controlling the switching elements, signal lines supplying data signal to the switching elements, terminals making electrical connections between the scanning and signal lines and external driving elements, and comprising a metal layer which forms the scanning line or the signal line, an interlayer film formed on the metal layer, and a transparent electrode forming the pixel electrode, contact holes formed in the interlayer film, through which the metal layer and the transparent electrode are connected to each other via a transparent electrode formed in the contact hole, and an anisotropic conductive film connecting the active matrix substrate to the external driving elements, the device is further characterized (1) by providing dummy contact holes in the passivation film between adjacent terminals, or by forming the contact holes as a plurality of via holes or contact holes having a diameter that is larger than the diameter of the conductive particles in the anisotropic conductive film or by providing these contact holes in a region outside the region of connection with the external drive elements, so that it is possible to prevent an increase in resistance caused by uneven distribution of conductive particles when an anisotropic conductive film is used for making connections, thereby achieving a good contact in the active matrix liquid-crystal display device.

DESCRIPTION OF THE PREFERRED EMBODIMENTS

Preferred embodiments of the present invention will be explained hereunder with reference to the attached drawings.

Figure 5A:
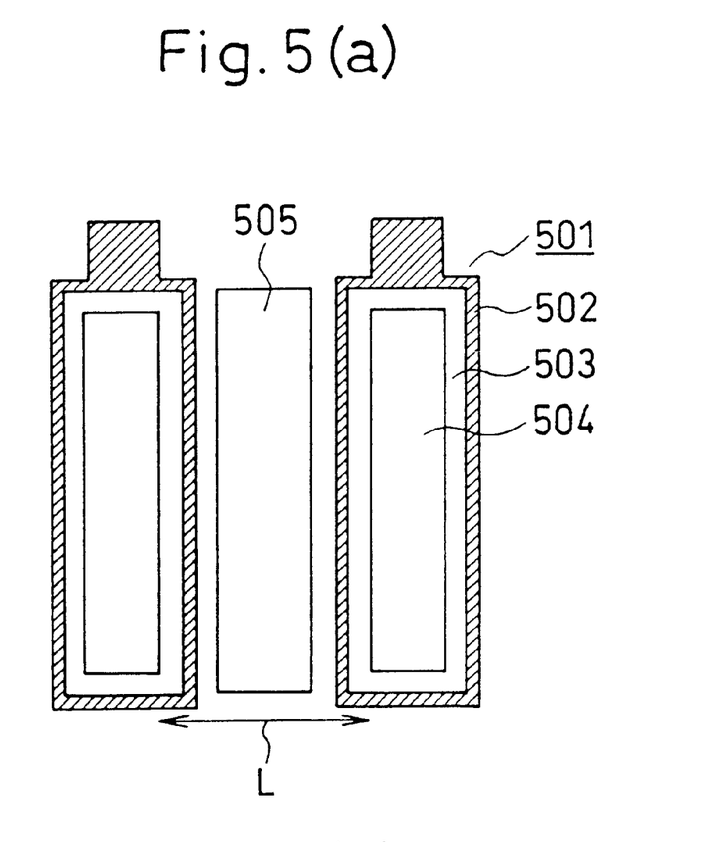
FIGS. 5(a)–(b) are drawings illustrating a terminal TEG experiment.
Figure 5B:
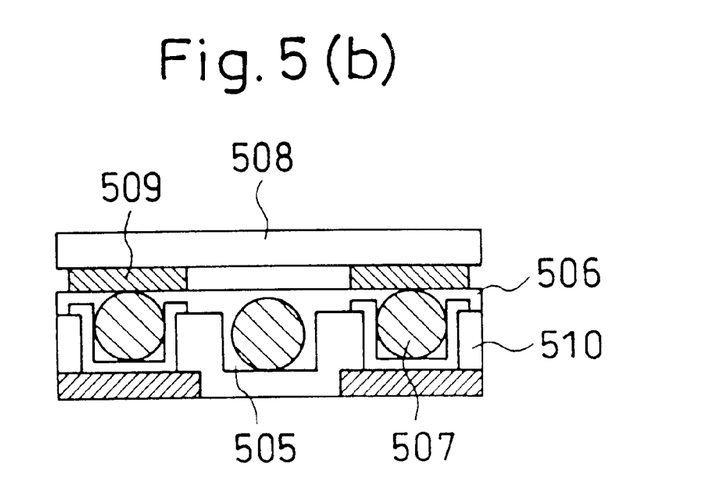

In order to overcome the above-mentioned problems shown in the conventional active matrix liquid-crystal display device, the inventors of the invention had conducted in several experiments so as to obtain information to specify and clarify the conditions to be changed from technical point of views, as follows;

As a first experiment, a contact hole 504 was formed in an organic film 510 formed on a metal film layer 502 as shown in FIGS. 5(a)–(b), and at a terminal TEG 501 on which a transpasent electrode 503 being formed, an anisotropic conductive film (ACF) 506 was applied thereto and the number of conductive particle remaining per unit area on the organic film 510 between terminals was counted. TAB leads 509 of TAB 508 contact the conductive particles 507 in the contact hole 504.

Figure 8:
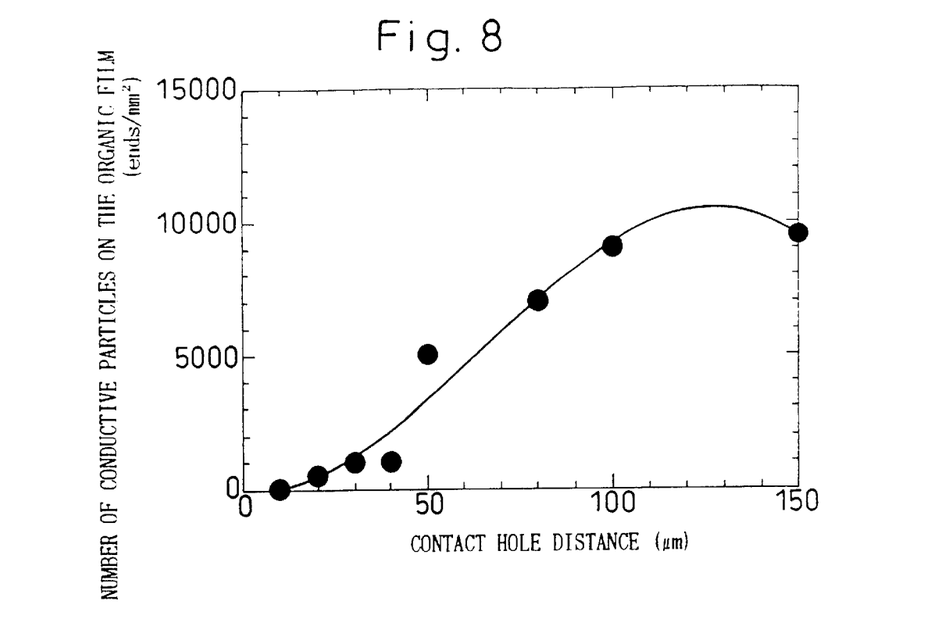
FIG. 8 is a drawing illustrating a terminal TEG experiment.

The relationship between the distance L between contact holes and the number of conductive particles per unit area on the organic film is shown in FIG. 8.

From these results, it can be seen that, if the distance between terminals exceeds 40 μm, there is an increase in the number of conductive particles on the organic film, and it is thought that when the organic film is attached thereto, the conductive particle would probably be moved by approximately 15 μm, and thus if when a distance between contact holes is 4 μm or less, the conductive particles would fall into the contact hole.

Figure 9:
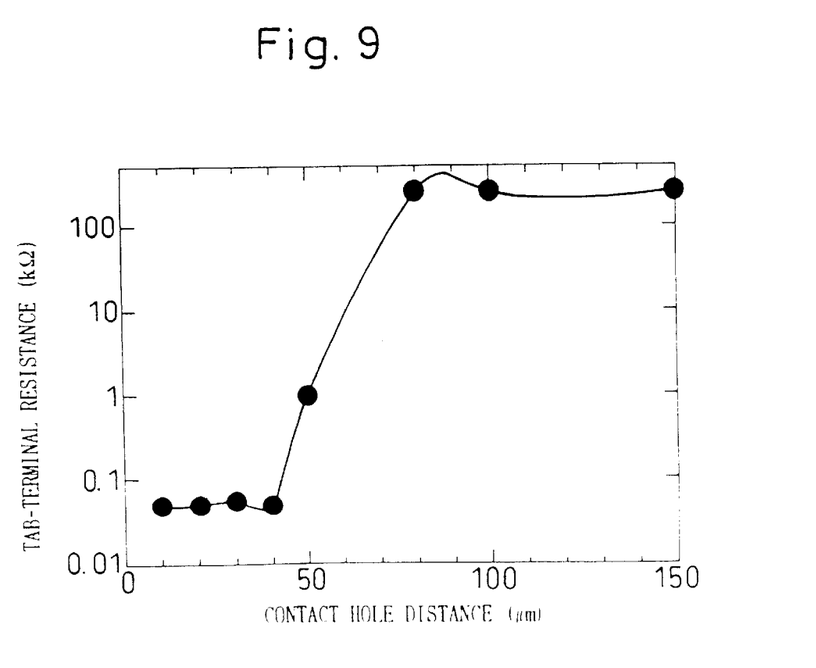
FIG. 9 is a drawing illustrating a terminal TEG experiment.

FIG. 9 shows the contact resistance between the lower layer metal and the TAB via the anisotropic conductive film, and the distance between the contact holes.

From this, it can be seen that when the distance between contact holes exceeds about 40 μm, the contact resistance between the lower layer metal and the TAB starts to increase suddenly, and exceeds 100 kΩ at over 80 μm, making this impractical.

When the distance between the contact holes is short, there are almost no conductive particles on the organic film, so that a good contact is established between the metal layer and the TCP.

A contact hole 604 was formed in an organic film 610 formed on a metal film layer 602 as shown in FIGS. 6(a)–(b), and at a terminal 601 on which a transparent electrode 603 was formed. An anisotropic film (ACF) 606 was applied. When the distance between the contact holes 604 is large, however, many conductive particles 607 remain on the organic film, as shown in FIG. 6(b). The distance between the metal layer 602 and the TCP 608 being then the sum of the organic film thickness and the conductive particle diameter, thereby preventing the establishment of a good contact therebetween.

However, the usual distance between terminals is in the range from 50 to 100 μm. This is because positioning becomes extremely difficult when considering the connection to external terminals when the distance is shorter than 50 μm, and considering the contact formation margin, it is necessary to make the contact spacing even larger.

Therefore, in the present invention by establishing the distance between a dummy contact hole 505 and a contact hole 504 to be approximately 10 to 50 μm, which is 3 to 20 times the diameter of the conductive particles, it is possible to have the conductive particles fall into the contact hole 504 and dummy contact hole 505, so that a good contact is established, as shown in FIG. 5(b).

Figure 7A:
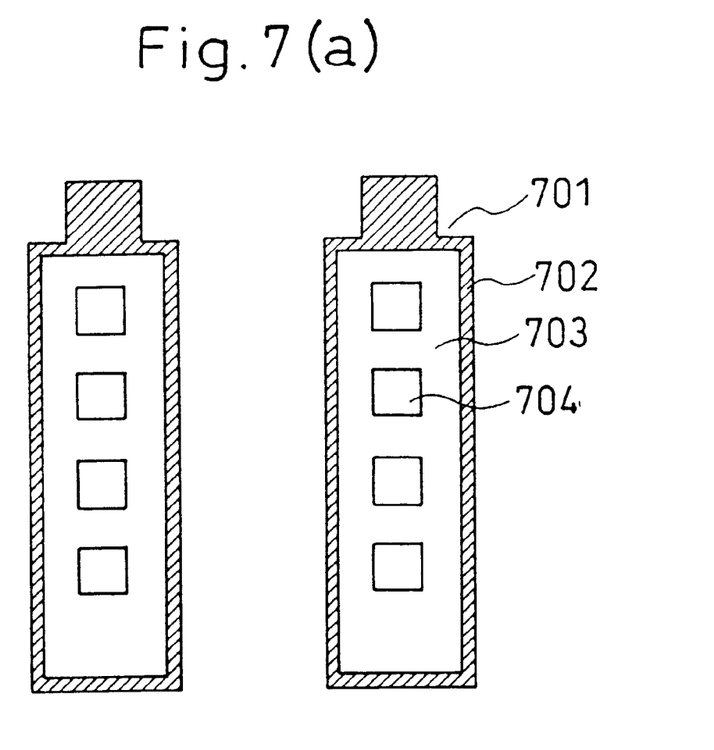
FIGS. 7(a)–(b) are drawings illustrating a terminal TEG experiment.

As a second experiment, in a terminal 701 having a metal layer 702, a contact hole was formed by a plurality of via holes 704 formed in the metal layer, as shown in FIG. 7(a), and over this a transparent electrode 703 was formed.

An anisotropic conductive film 706 was placed over this and pressed onto it to measure the resistance between the transparent electrode and the TAB 608.

Figure 10:
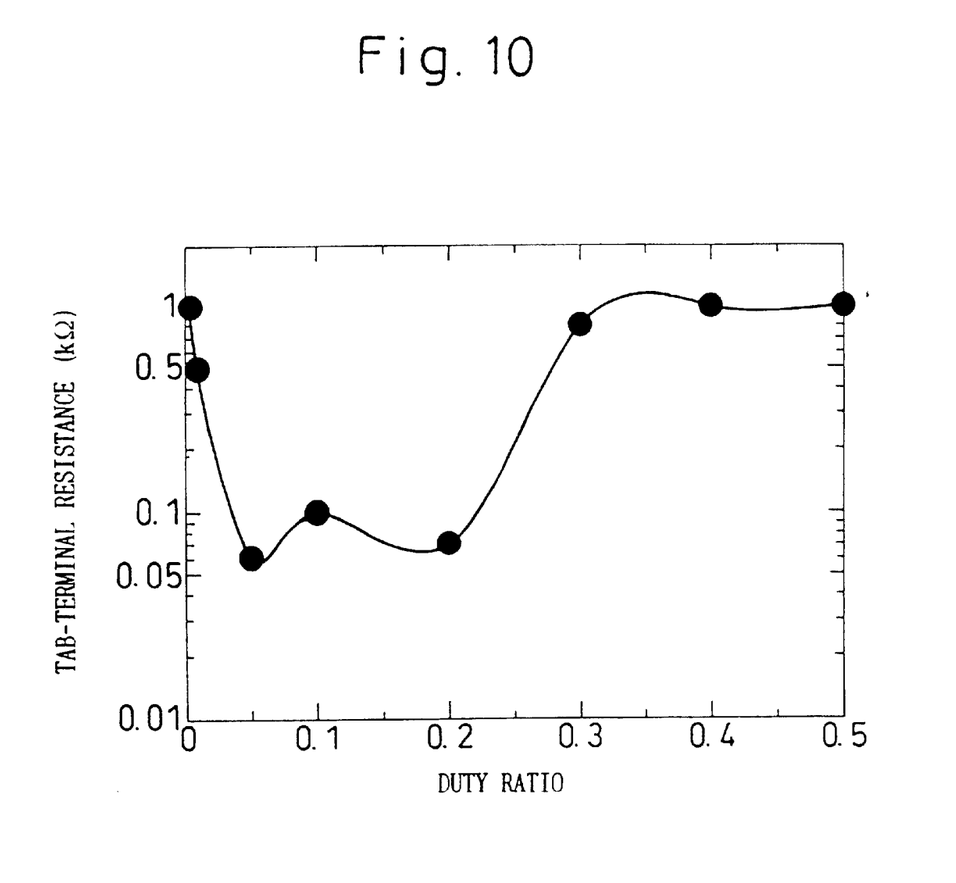
FIG. 10 is a drawing illustrating a terminal TEG experiment.

With the overall surface area of the via holes 704 as S1 and the surface area of the transparent electrode 703 as S2, FIG. 10 shows the duty ratio of S1/S2 and the resistance.

With the range of $0.01 \leq$ duty ratio $\leq 0.3$, and particularly within the range $0.05 \leq$ duty ratio $\leq 0.3$, it was seen that the resistance is low. The reason the resistance increases with a duty ratio of larger than 0.3 is presumed to be because of insufficient conductive particles 707 on the transparent electrode 703.

It is thought that the resistance increases at a duty ratio of less than 0.01 because of the excessively small size of the via holes 704, thereby causing an increase in the resistance of the contact between the transparent electrode 703 and the lower layer metal 702 through the via holes 704.

Figure 7B:
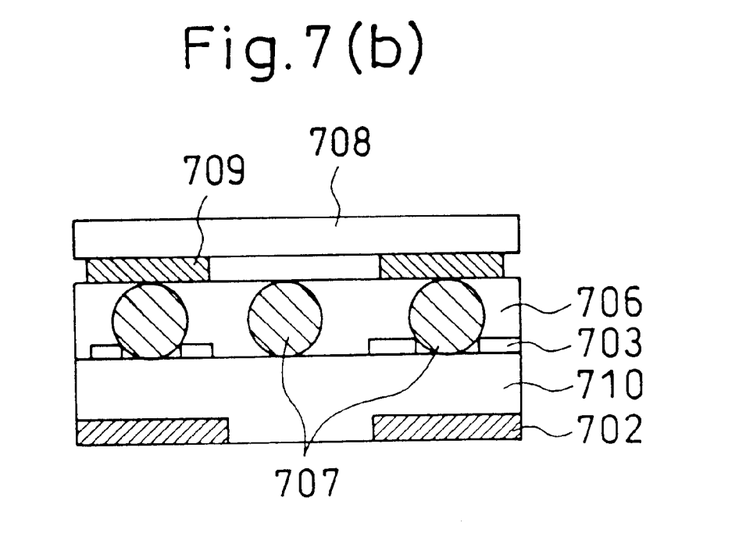

It is sufficient to make the size of the via holes 704 larger than the maximum diameter of the conductive particles in the ACF. As a result, it is possible to establish a good contact, as shown in FIG. 7(b).

Embodiments of the present invention are described in detail below, with reference made to relevant accompanying drawings.

It will be understood, however, that the present invention is not restricted to the embodiments described herein, and can take on other various forms, within the spirit of the present invention.

Figure 2A:
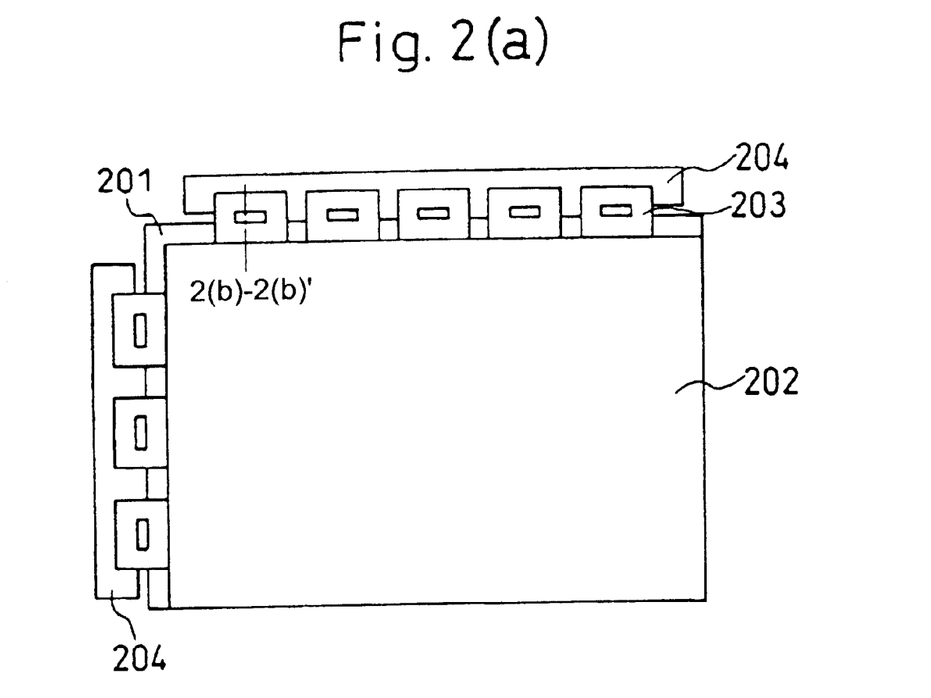
FIGS. 2(a)–(b) are drawings showing a liquid-crystal display device according to the first embodiment of the present invention, FIG. 2(a) being an overall view and FIG. 2(b) being a cross-section in the direction indicated by 2(b)–2(b)'.
Figure 2B:
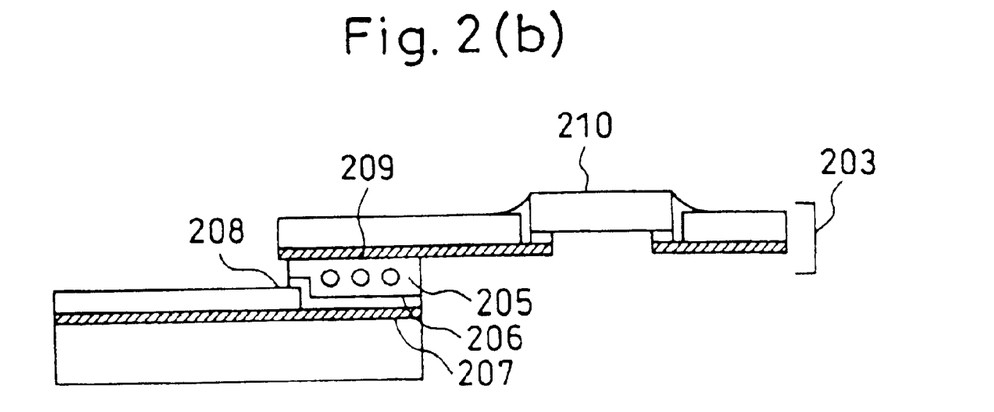

FIGS. 2(a)–(b) show a simplified view of the first embodiment of the present invention.

A liquid-crystal display device according to this embodiment has a liquid-crystal panel formed by a thin-film transistor substrate (TFT substrate) 201, a color filter substrate (CF substrate) 202, and a liquid crystal sandwiched between these elements, and a large number of TABs 203 forming drivers for driving the liquid-crystal panel.

The TABs 203 are provided on two printed circuit boards 204 that are disposed along two sides of the liquid-crystal panel, which is rectangular, the base film of each TAB being connected by soldering to a signal processing printed circuit board.

The above-noted TABs have a bare chip 210 as an integrated circuit on a base film, the terminals of the bare chip being connected to TAB lead wires 209 which are wiring patterns formed on the base film.

These TABs 203 are electrically connected to the terminals 208 of the TFT substrate via an ACF 205 and transparent electrode 206.

The display part of the TFT substrate forming the liquid-crystal panel has the same configuration as disclosed in the Japanese Patent Application No. 9-323423.

The thickness of the organic film is 3 μm. Terminals leading from scanning lines and signal lines are provided in the area surrounding the TFT substrate, these being grouped into terminal blocks each having the same number of terminals as the TAB terminals.

Figure 1A:
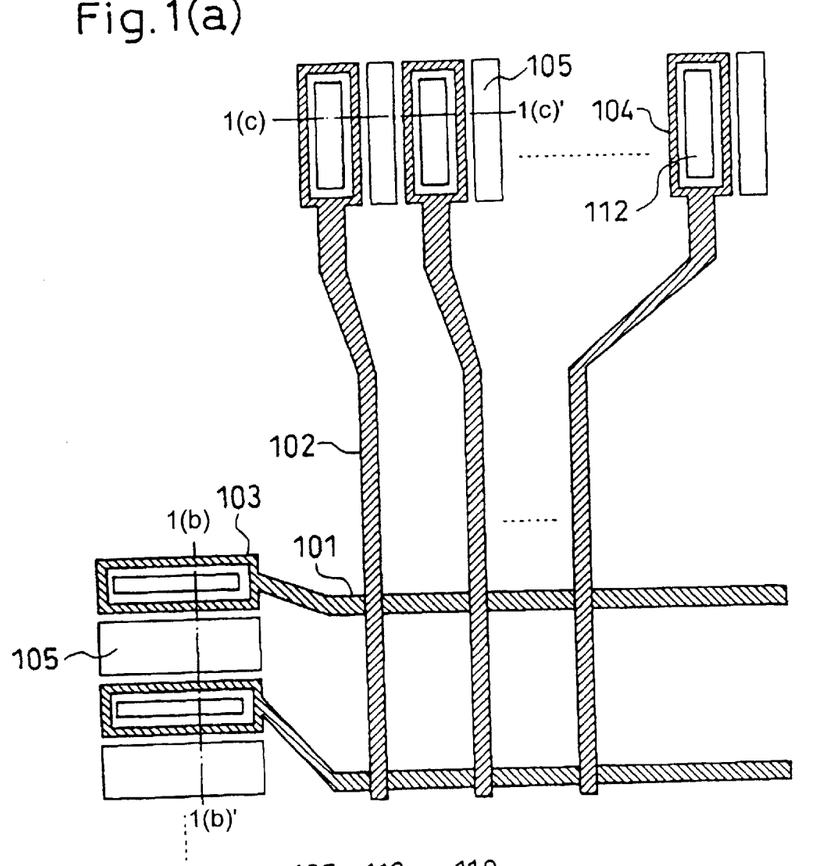
FIGS. 1(a)–(c) are drawings illustrating the terminal part of the first embodiment of the present invention, FIG. 1(a) showing a plan view thereof, and FIG. 1(b) and FIG. 1(c) being cross-section views in the directions indicated by 1(b)–1(b)' and 1(c)–1(c)'.
Figure 1B:
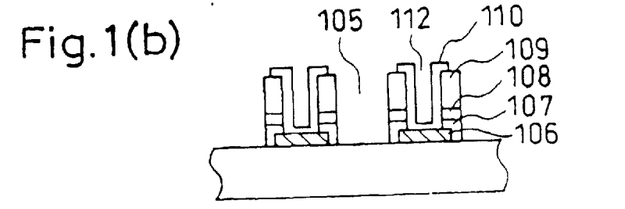

FIG. 1(a) is a plan view and FIG. 1(b) is a cross-section view of the terminals that make connections to external TABs.

The gate terminal 103 is connected to the scanning line 101, and is formed by a gate metal layer 106, a gate insulation film 107, a passivation film 108, an organic film 109, and a transparent electrode 110, and the gate metal layer 106 and transparent electrode 110 are connected via a contact hole 112.

The size of the gate metal layer 106 that forms the gate terminal 103 is 70×200 µm, the distance between terminals is 100 µm, and the contact holes are 50×150 µm.

From the results of the above-described basic experiments, a 80×200 µm dummy contact hole 105 was provided on the organic film between terminals, so that not many conductive particles of the anisotropic conductive film remain on the organic film.

By doing this, the distance from the dummy contact hole from an end of the terminal becomes 10 µm, so that the conductive particles from the ACF fall into either a contact hole 112 or a dummy contact hole 105.

Figure 1C:
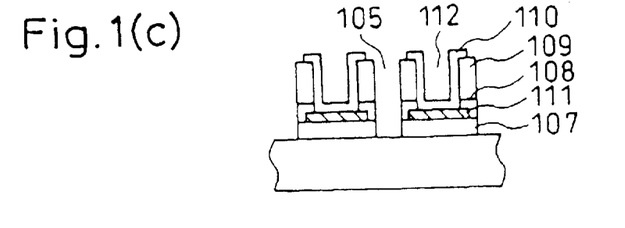

The data terminal 104 is connected to the data line 102, and is formed by a data metal layer 111, a passivation film 108, an organic film 109, and a transparent electrode 110, the data metal layer 111 and transparent electrode 110 being connected via a contact hole 112.

The size of the data metal layer 111 that forms the data terminal 104 is 70×200 µm, the distance between terminals is 50 µm, and the contact hole 112 is 50×150 µm. A 30×200 µm dummy contact hole 105 is provided on the organic film between terminals.

The terminal and TAB leads are mounted by hot pressing, with an intervening anisotropic conductive film (ACF).

As an anisotropic conductive film, a large number of conductive particles formed by nickel and gold plating the surface of fine spherical plastic beads, are dispersed in a binder of epoxy resin.

The outer diameter of the conductive particles in the anisotropic conductive film is 5 µm, and the density of the conductive particle is 10,000/mm$^2$. The anisotropic conductive film is connected by hot pressing to the TAB.

When this is done, by providing the dummy contact holes 105, there are almost no conductive particles remaining on the organic film.

The diameter of a crushed conductive particle is approximately 3 µm, and a good contact, with a contact resistance of no more than 100Ω, is established between the terminals and the TCP.

Figure 3A:
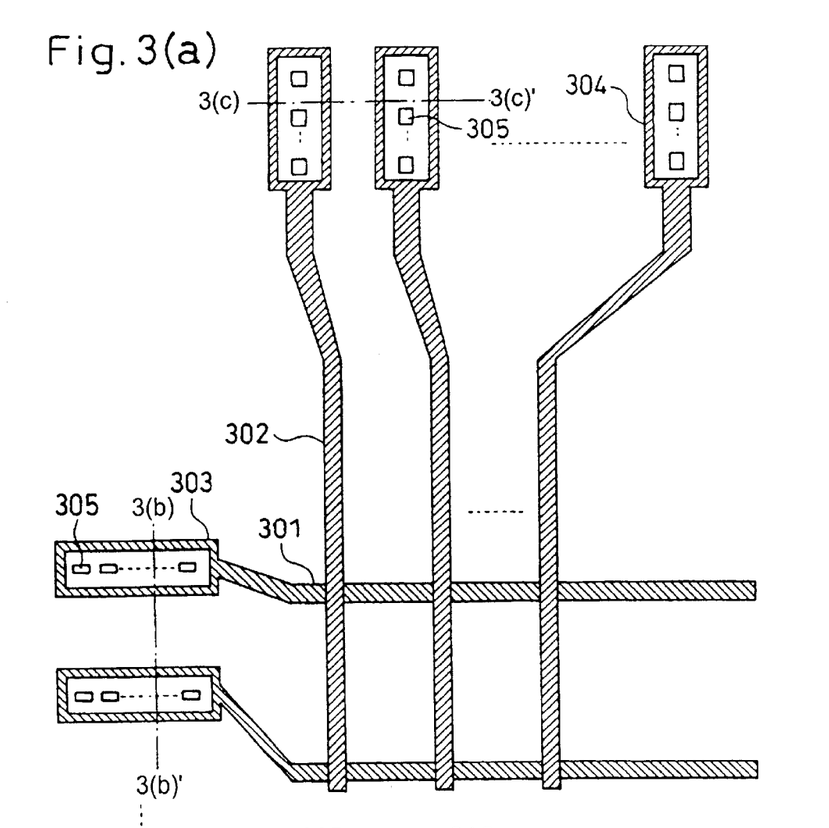
FIGS. 3(a)–(c) are drawings showing the terminal part of a liquid-crystal display device according to the second embodiment of the present invention, FIG. 3(a) being a plan view, and FIG. 3(b) and FIG. 3(c) being cross-section views in the directions indicated by 3(b)–3(b)' and 3(c)–3(c)'.
Figure 3B:
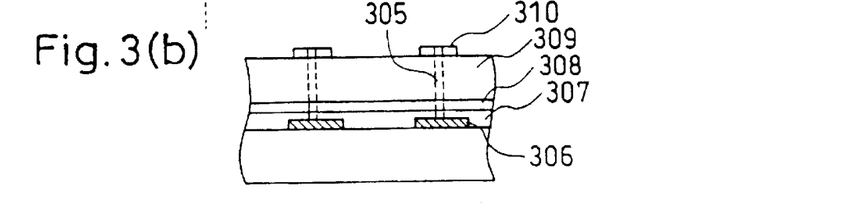
Figure 3C:
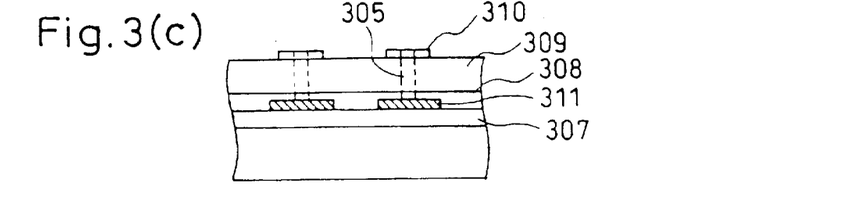

FIG. 3(a) is a plan view and FIGS. 3(b)–(c) are cross-section views of the terminal making a connection to an external TAB. The configuration of the display region of this liquid-crystal display is the same as that of the first embodiment, and will not be described herein.

A gate electrode 303 is connected to scanning line 301, and is formed by a gate metal layer 306, a gate insulation film 307, a passivation film 308, an organic film 309, and a transparent electrode 310, the gate metal layer 306 and the transparent electrode 310 being connected via a contact hole.

The sizes of the gate metal layer 306 that forms the terminal and the transparent electrode 310 are the same as in the first embodiment.

Ten via holes 305 having dimensions of 10×10 µm are provided as a contact hole. The data terminal 304 is connected to data line 302 and has the same configuration, with the exception of the gate metal layer 311 being used for the gate metal layer 306.

An anisotropic conductive film is hot pressed onto these terminals and connected to a TAB. When this is done, the duty ratio between the surface area of the contact hole and the surface area of the transparent electrode is 0.1, and the contact resistance between the terminal and TCP is less than 100Ω, so that a good contact is established.

Figure 4A:
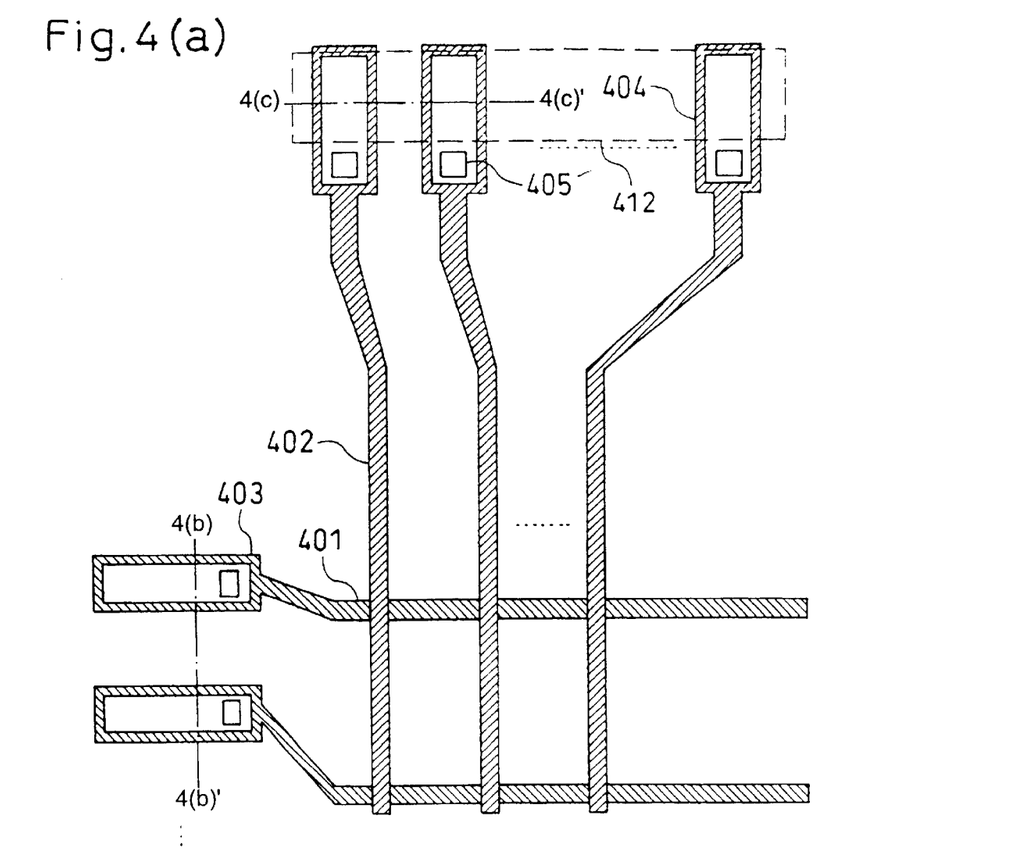
FIGS. 4(a)–(c) are drawings showing the terminal part of a liquid-crystal display device according to the third embodiment of the present invention, FIG. 4(a) being a plan view, and FIG. 4(b) and FIG. 4(c) being cross-section views in the directions indicated by 4(b)–(b)' and 4(c)–(c)'.
Figure 4B:
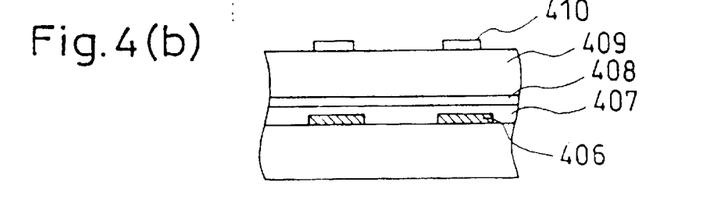
Figure 4C:
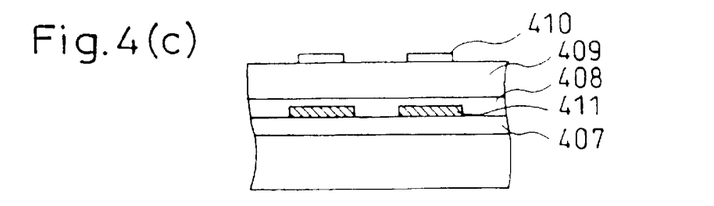

FIG. 4(a) is a plan view and FIGS. 4(b)–(c) are cross-section views of the terminal part making connection to an external TAB.

The configuration of this display region is the same as that of the first embodiment, and is not described herein. The gate terminal 403 is connected to scanning line 401, and is formed by a gate metal layer 406, a gate insulation film 407, a passivation film 408, an organic film 409, and a transparent electrode 410, the gate metal layer 406 and transparent electrode 410 being connected via a contact hole 405.

The sizes of the gate metal layer forming the terminal and the transparent electrode are the same as the first embodiment. The contact hole is formed by providing a 30×20 µm via hole, avoiding the TAB pressing region 412. The data terminals 404 are connected to the data line 402, and have the same type of configuration.

An anisotropic conductive film is hot pressed onto these terminals and connected to a TAB.

When this is done, the duty ratio between the surface area of the contact hole and the surface area of the transparent electrode is 0.6, and the contact resistance between the terminal and TAB is less than 100Ω, so that a good contact is established.

From these explanations about the embodiments of the present invention, it is apparent that the active matrix liquid-crystal display device of the present invention can be produced by a method, for a first example, comprising a step of forming a dummy contact hole in the interlayer film and between the terminals being adjacently arranged to each other.

Further, the active matrix liquid-crystal display device of the present invention can be produced by a method, for a second example, comprising a step of forming at least one of the contact holes so as to have a diameter being greater than the maximum diameter of conductive particles in the anisotropic conductive film.

And as a third example of the method for producing the active matrix liquid-crystal display device of the present invention, the method comprises a step of forming the contact hole so as to be disposed in a location other than a location of connection to an external driving element.

In the method for producing an active matrix liquid-crystal display device according to the above-mentioned second and third examples, the method comprises a step of for establishing the ratio of surface areas between the plurality of via holes or contact holes and the transparent electrode over the terminal to be at least 0.01 and no greater than 0.3.

More over, in the method for producing an active matrix liquid-crystal display device according to the above-mentioned first to third examples, the method comprises a step of forming the interlayer film with an organic film or a laminate formed by an organic film and a non-organic passivation film.

By adopting the configuration described in detail above, according to the present invention, in an active matrix substrate with an organic film in the terminal part, it is possible to achieve a stable, high-quality connection between the TCP and the terminal when mounting the TCP. This is achieved by providing dummy contact holes, so that the conductive particles of the anisotropic conductive film remaining on the organic film are sufficiently reduced. By establishing the surface area ratio between the transparent electrode forming the terminal and the contact hole in the range from 0.01 to 0.3, this can be achieved even if sufficient conductive particles of the anisotropic conductive film are left on the organic film.

What is claimed is:

1. An active matrix liquid-crystal display device comprising:

a substrate;

a plurality of switching elements and a plurality of pixel electrodes formed in a matrix arrangement on said substrate;

scanning lines controlling said switching elements;

signal lines supplying data signal to said switching elements;

terminals making electrical connections between said scanning and signal lines and external driving elements, and comprising a metal layer which forms said scanning line or said signal line, an interlayer film formed on said metal layer, and a transparent electrode forming said pixel electrode;

holes formed in said interlayer film, through which said metal layer and said transparent electrode are connected to each other via a transparent electrode formed in at least one of said holes; and an anisotropic conductive film connecting said active matrix substrate to said external driving elements, wherein at least one of said holes is formed so as to have a diameter being greater than the maximum diameter of conductive particles in said anisotropic conductive film.

2. An active matrix liquid-crystal display device according to claim 1, wherein at least one of said holes is disposed in a location other than a location of connection to an external driving element.

3. An active matrix liquid-crystal display device according to claim 1, wherein the ratio of surface areas between said plurality of holes and the transparent electrode over the terminal is at least 0.01 and no greater than 0.3.

4. An active matrix liquid-crystal display device according to claim 3, wherein said surface areas between of said plurality of holes is a total surface areas of summing up the respective surface areas of said plurality of said holes formed in said transparent electrode.

5. An active matrix liquid-crystal display device according to claim 1, wherein said interlayer film is an organic film or a laminate formed by an organic film and a non-organic passivation film.

6. An active matrix liquid-crystal display device according to claim 1, wherein said plurality of holes are contact holes.

7. An active matrix liquid-crystal display device according to claim 1, wherein said plurality of holes are via holes.

8. A method for producing an active matrix liquid-crystal display device comprising, a substrate, a plurality of switching elements and a plurality of pixel electrodes formed in a matrix arrangement on said substrate, scanning lines controlling said switching elements, signal lines supplying data signal to said switching elements, terminals making electrical connections between said scanning and signal lines and external driving elements, and comprising a metal layer which forms said scanning line or said signal line, an interlayer film formed on said metal layer, and a transparent electrode forming said pixel electrode, holes formed in said interlayer film, through which said metal layer and said transparent electrode are connected to each other via a transparent electrode formed in at least one of said holes, and an anisotropic conductive film connecting said active matrix substrate to said external driving elements, wherein said method further comprises forming at least one of said holes so as to have a diameter being greater than the maximum diameter of conductive particles in said anisotropic conductive film.

9. A method for producing an active matrix liquid-crystal display device according to claim 8, wherein said method further comprises forming at least one of said holes so as to be disposed in a location other than a location of connection to an external driving element.

10. An method for producing an active matrix liquid-crystal display device according to claim 8, wherein said method further comprises establishing the ratio of surface areas between said plurality of holes and the transparent electrode over the terminal to be at least 0.01 and no greater than 0.3.

11. An method for producing an active matrix liquid-crystal display device according to claim 8, wherein said method further comprises a step of forming said interlayer film with an organic film or a laminate formed by an organic film and a non-organic passivation film.

* * * * *